United States Patent
Kuenemund

(10) Patent No.: US 10,418,999 B2
(45) Date of Patent: Sep. 17, 2019

(54) PROGRAMMABLE LOGIC CIRCUIT AND METHOD FOR IMPLEMENTING A BOOLEAN FUNCTION

(71) Applicant: Infineon Technologies AG, Neubiberg (DE)

(72) Inventor: Thomas Kuenemund, Munich (DE)

(73) Assignee: Infineon Technologies AG, Neubiberg (DE)

( * ) Notice: Subject to any disclaimer, the term of this patent is extended or adjusted under 35 U.S.C. 154(b) by 87 days.

(21) Appl. No.: 15/701,478

(22) Filed: Sep. 12, 2017

(65) Prior Publication Data
US 2018/0091155 A1    Mar. 29, 2018

(30) Foreign Application Priority Data
Sep. 23, 2016    (DE) ........................ 10 2016 118 000

(51) Int. Cl.
*H03K 19/177*    (2006.01)
*H03K 19/003*    (2006.01)
(Continued)

(52) U.S. Cl.
CPC . *H03K 19/17708* (2013.01); *H03K 19/00315* (2013.01); *H03K 19/0185* (2013.01);
(Continued)

(58) Field of Classification Search
None
See application file for complete search history.

(56) References Cited

U.S. PATENT DOCUMENTS

| 9,431,398 B2 * | 8/2016 | Kuenemund .... H03K 19/00315 |
| 2005/0134317 A1 | 6/2005 | Gliese et al. |

(Continued)

FOREIGN PATENT DOCUMENTS

| DE | 10354501 A1 | 6/2005 |
| DE | 102004011433 A1 | 10/2005 |

(Continued)

OTHER PUBLICATIONS

Rhyne "Fundamentals of Digital Systems Design" N. J., 1973 pp. 70-71.*

(Continued)

*Primary Examiner* — Minh D A
*Assistant Examiner* — James H Cho
(74) *Attorney, Agent, or Firm* — Viering, Jentschura & Partner MBB

(57) ABSTRACT

According to an embodiment, a programmable logic circuit is described comprising a first data bit input to receive a first data bit a and a second data bit input to receive a second data bit b, a first program bit input to receive a first program bit $p_1$, a second program bit input to receive a second program bit $p_2$, a third program bit input to receive a third program bit $p_3$ and a fourth program bit to receive a fourth program bit $p_4$ and an output configured to output $$(((a \wedge b) \vee (p_1 \wedge a) \vee (p_2 \wedge b)) \wedge (p_3 \vee b \vee a)) \vee (a \wedge b \wedge p_4).$$

11 Claims, 10 Drawing Sheets

(51) Int. Cl.
*H03K 19/0185* (2006.01)
*H03K 19/094* (2006.01)
*H03K 19/173* (2006.01)
*H03K 19/20* (2006.01)

(52) U.S. Cl.
CPC ....... *H03K 19/094* (2013.01); *H03K 19/1733* (2013.01); *H03K 19/17768* (2013.01); *H03K 19/20* (2013.01)

(56) References Cited

U.S. PATENT DOCUMENTS

| | | | |
|---|---|---|---|
| 2007/0279090 A1 | 12/2007 | Gliese | |
| 2014/0232432 A1* | 8/2014 | Fish | G06F 9/3869 326/104 |
| 2016/0329895 A1* | 11/2016 | Ge | H03K 19/0013 |
| 2017/0317677 A1* | 11/2017 | Muchsel | H04L 9/0866 |

FOREIGN PATENT DOCUMENTS

| | | |
|---|---|---|
| WO | 8502730 A1 | 6/1985 |
| WO | 9411950 A1 | 5/1994 |

OTHER PUBLICATIONS

Masoud Rostami et al., "A Primer onHardware Security: Models,Methods, and Metrics", Proceedings of the IEEE, Aug. 2014, pp. 1283-1295, vol. 102, No. 8.

Jiliang Zhang, "A Practical Logic Obfuscation Technique for Hardware Security", IEEE Transactions on Very Large Scale Integration (VLSI) Systems, Mar. 2016, pp. 1193-1197, vol. 24, No. 3.

Jeyavijayan Rajendran et al., "Security Analysis of Integrated Circuit Camouflaging", CCS'13 Nov. 4-8, 2013, Berlin Germany.

* cited by examiner

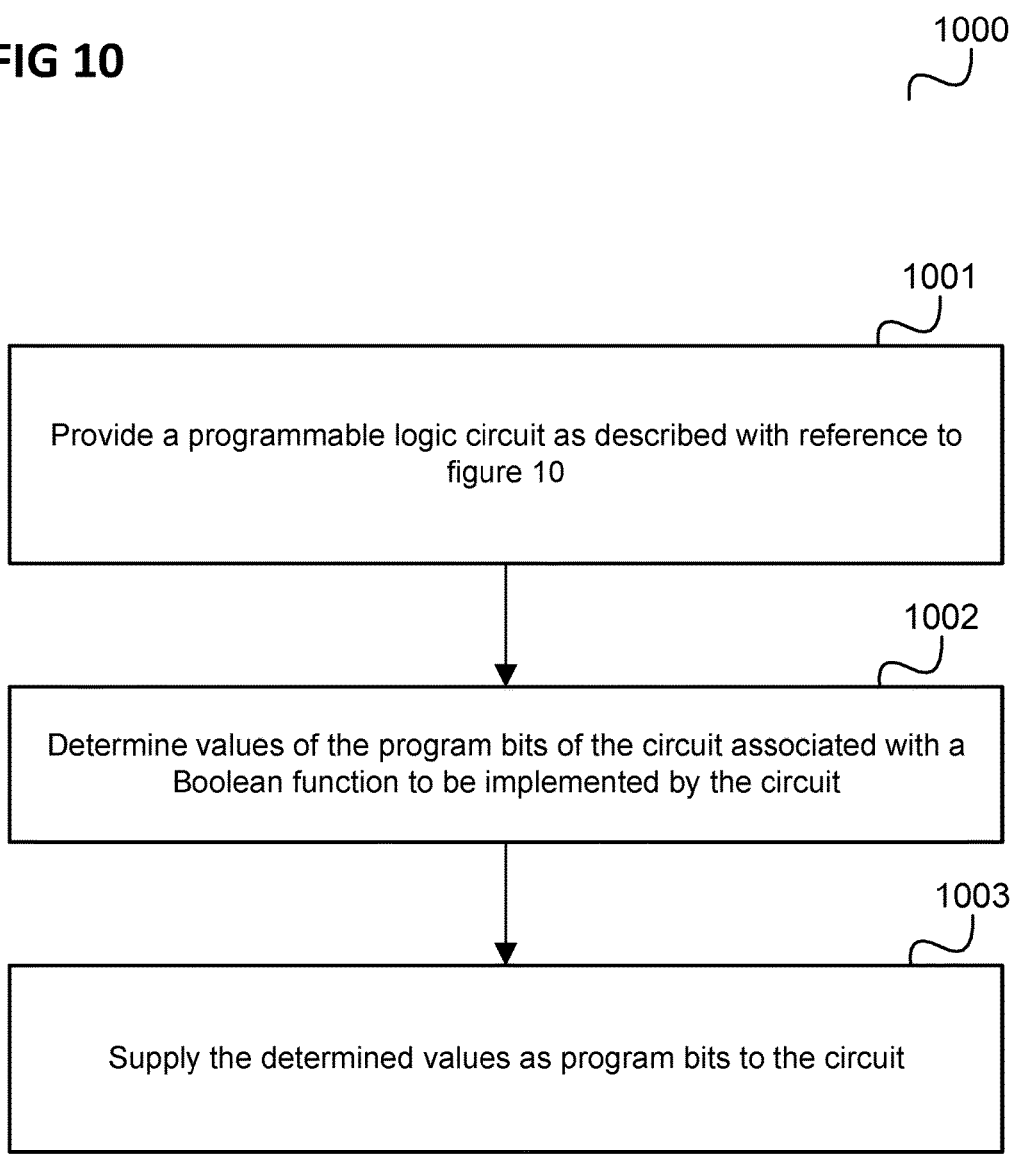

PROGRAMMABLE LOGIC CIRCUIT AND METHOD FOR IMPLEMENTING A BOOLEAN FUNCTION

CROSS-REFERENCE TO RELATED APPLICATION

This application claims priority to German Patent Application Serial No. 10 2016 118 000.9, which was filed Sep. 23, 2016, and is incorporated herein by reference in its entirety.

TECHNICAL FIELD

The present disclosure relates to programmable logic circuits and methods for implementing a Boolean function.

BACKGROUND

Reverse Engineering (RE) of integrated circuits (ICs) can be considered as one of the most serious threats to semiconductor industry, since it may be misused by an attacker to steal and/or pirate a circuit design. An attacker who successfully reverse engineers an integrated circuit can fabricate and sell a similar, i.e. cloned circuit, and illegally sell and reveal the design.

Therefore concepts and techniques that thwart reverse engineering of integrated circuits are desirable.

SUMMARY

According to an embodiment, a programmable logic circuit is provided including a first data bit input to receive a first data bit a and a second data bit input to receive a second data bit b, a first program bit input to receive a first program bit $p_1$, a second program bit input to receive a second program bit $p_2$, a third program bit input to receive a third program bit $p_3$ and a fourth program bit to receive a fourth program bit $p_4$ and an output configured to output $$(((a \wedge b) \vee (p_1 \wedge a) \vee (p_2 \wedge b)) \wedge (p_3 \vee b \vee a)) \vee (a \wedge b \wedge p_4).$$

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. In the following description, various aspects are described with reference to the following drawings, in which:

FIG. 10 shows a flow diagram for implementing a Boolean function.

DETAILED DESCRIPTION

The following detailed description refers to the accompanying drawings that show, by way of illustration, specific details and aspects of this disclosure in which the present disclosure may be practiced. Other aspects may be utilized and structural, logical, and electrical changes may be made without departing from the scope of the present disclosure. The various aspects of this disclosure are not necessarily mutually exclusive, as some aspects of this disclosure can be combined with one or more other aspects of this disclosure to form new aspects.

Figure 1:
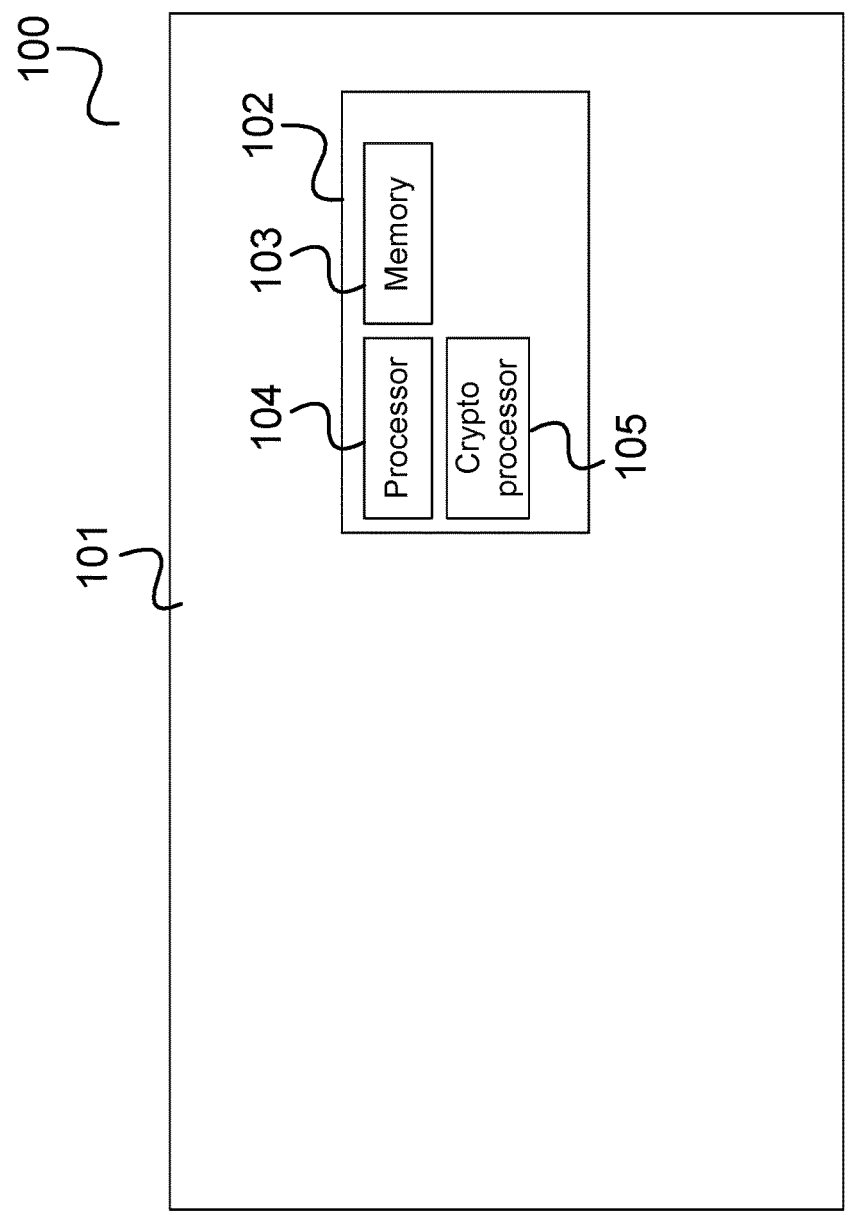
FIG. 1 shows a chip card according to an embodiment.

It is desirable for a large variety of chips to be protected against reverse engineering, in particular for chips used in security-related contexts such as on a chip card as illustrated in FIG. 1.

FIG. 1 shows a chip card 100 according to an embodiment.

The chip card 100 includes a carrier 101 on which a chip card module 102 is arranged. The chip card module 102 includes various data processing components like for example a memory 103, a processor 104 or for example a dedicated crypto processor 105.

Approaches to thwart reverse engineering of chips like the chip card module 102 may deploy camouflaged circuits (e.g. for implementation of proprietary algorithms for Security ICs) that necessitate process technology extensions like doping profile modifications or faked contacts or vias that entail significantly increased area and energy consumption. Thus, these measures are often too expensive for mass products. Other approaches aim at hardware-level logic obfuscation techniques for reconfigurable logic barriers to prevent IC piracy.

For reconfigurable logic barriers very simple gates (e.g. XOR (exclusive OR) or MUX (multiplexer)) may be used or gates representing Look-Up-Tables (LUT) may be used (without regard about the transistor-level realization of these LUTs). The latter can be realized by means of implementing assemblies of all the relevant basic Boolean gate functions, as well as appropriate multiplexers, but this approach entails tremendous area and wiring overhead, as well as prohibitive power and delay penalties.

"Programmable Complex Gates (PCG)" may be used to implement the most frequently used basic gates NAND (not AND), NOR (not OR), ANDNOR, and ORNAND, depending on certain control bits. Thus, Circuit Camouflage by means of PCG seems to be promising if the control bits may be assumed to be virtually unknown to the attacker (i.e. very hard to reverse engineer, e.g. based on a Boolean secret, e.g. implemented by a circuit whose output depends on a relative doping concentrations related to MOSFETs of competing paths). Application examples include MED SBOXes (memory encryption/decryption substitution boxes), NLFSR (non linear feedback shift register) feedback logic, and FSMs (Finite State Machines).

The basic gates NAND, NOR, ANDNOR, and ORNAND are the most frequently used Standard Cells in Semi-Custom designs. ANDNOR and ORNAND gates are also deployed for the XOR (exclusive OR) and XNOR (exclusive NOR) cell. Thus, PCG that implement some or even all of the basic gates suggest them-selves as candidates for circuit camouflage to realize (real-time) programmable hardware.

Figure 2:
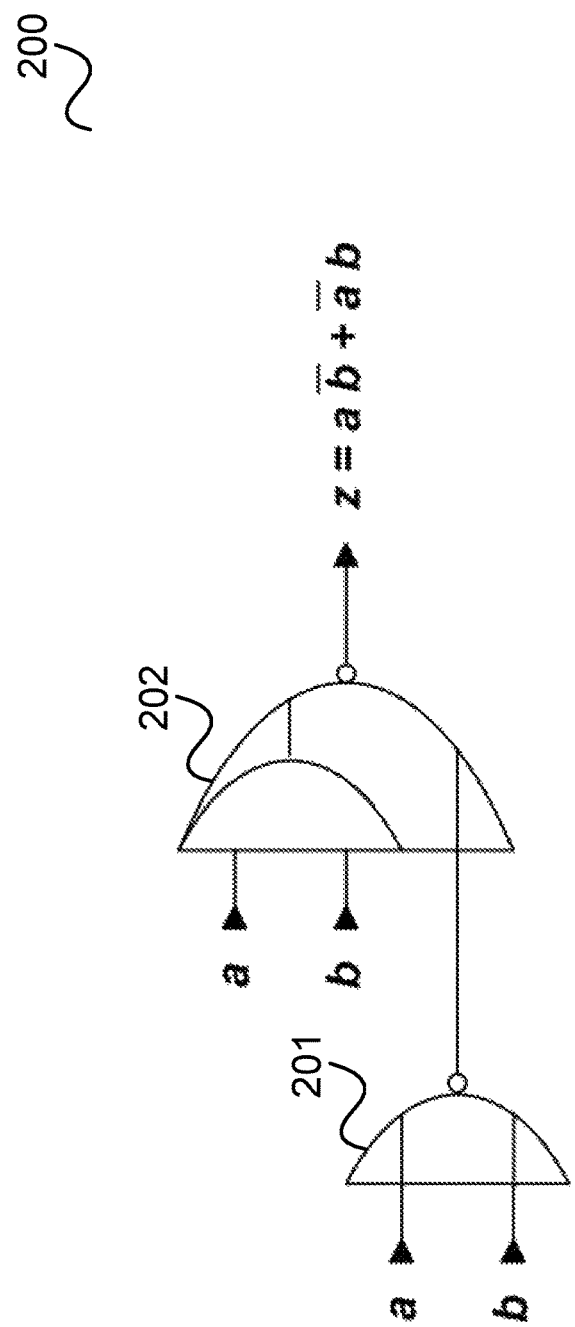
FIG. 2 shows an XOR cell.

FIG. 2 shows an XOR cell 200.

The XOR cell 200 includes a NOR gate 201 which receives inputs a and b and provides its output to the NOR input of an ANDNOR gate 202. The AND inputs of the ANDNOR gate 202 are supplied with a and b. The output of the XOR cell 200 is thus z=a$\bar{b}$+$\bar{a}$b.

Figure 3:
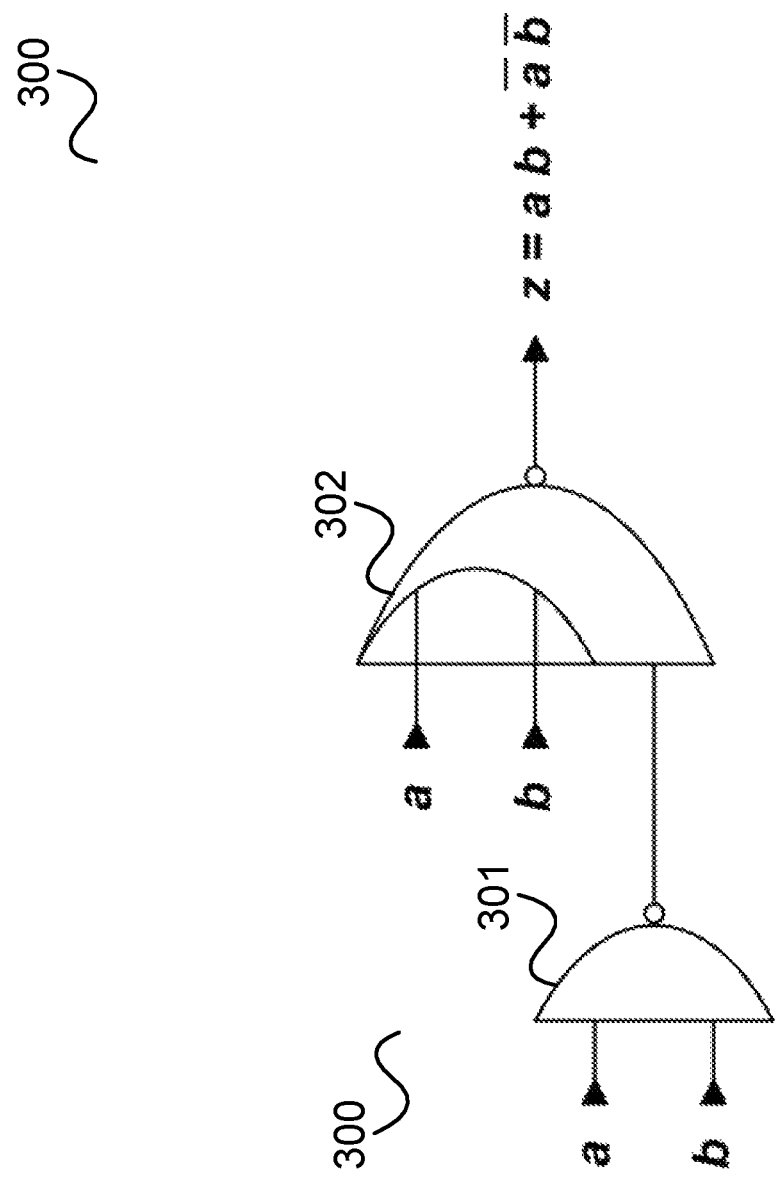
FIG. 3 shows an XNOR cell.

FIG. 3 shows an XNOR cell 300.

The XNOR cell 300 includes a NAND gate 301 which receives inputs a and b and provides its output to the NAND input of an ORNAND gate 302. The OR inputs of the ORNAND gate 302 are supplied with a and b. The output of the XNOR cell 300 is thus z=ab+$\bar{a}\bar{b}$.

In the following, a single Universal Gate UG(2) that implements all 16 possible Boolean Two-Input Functions is described that allows avoiding the LUT gate realization issue as mentioned above.

Table 1 lists the codings for all 16 different Boolean Two-Input Functions in terms of four control bits p4, p3, p2 and p1.

TABLE 1

| p4 | p3 | p2 | p1 | z | Standard Library Cell |
|----|----|----|----|---|------------------------|
| 0 | 0 | 0 | 0 | $a \cdot b + \bar{a} \cdot \bar{b}$ | EN2 (XNOR) |
| 0 | 0 | 0 | 1 | $a + \bar{b}$ | OR2I |
| 0 | 0 | 1 | 0 | $\bar{a} + b$ | OR2I |
| 0 | 0 | 1 | 1 | 1 | TIEONE |
| 0 | 1 | 0 | 0 | $a \cdot b$ | AND |
| 0 | 1 | 0 | 1 | $a$ | BUF(a) |
| 0 | 1 | 1 | 0 | $b$ | BUF(b) |
| 0 | 1 | 1 | 1 | $a + b$ | OR |
| 1 | 0 | 0 | 0 | $\overline{a+b}$ | NOR |
| 1 | 0 | 0 | 1 | $\bar{b}$ | INV(b) |
| 1 | 0 | 1 | 0 | $\bar{a}$ | INV(a) |
| 1 | 0 | 1 | 1 | $\overline{a \cdot b}$ | NAND |
| 1 | 1 | 0 | 0 | 0 | TIEZERO |
| 1 | 1 | 0 | 1 | $a \cdot \bar{b}$ | AN2I |
| 1 | 1 | 1 | 0 | $\bar{a} \cdot b$ | AN2I |
| 1 | 1 | 1 | 1 | $a \cdot \bar{b} + a \cdot b$ | EO2 (XOR) |

Figure 4:
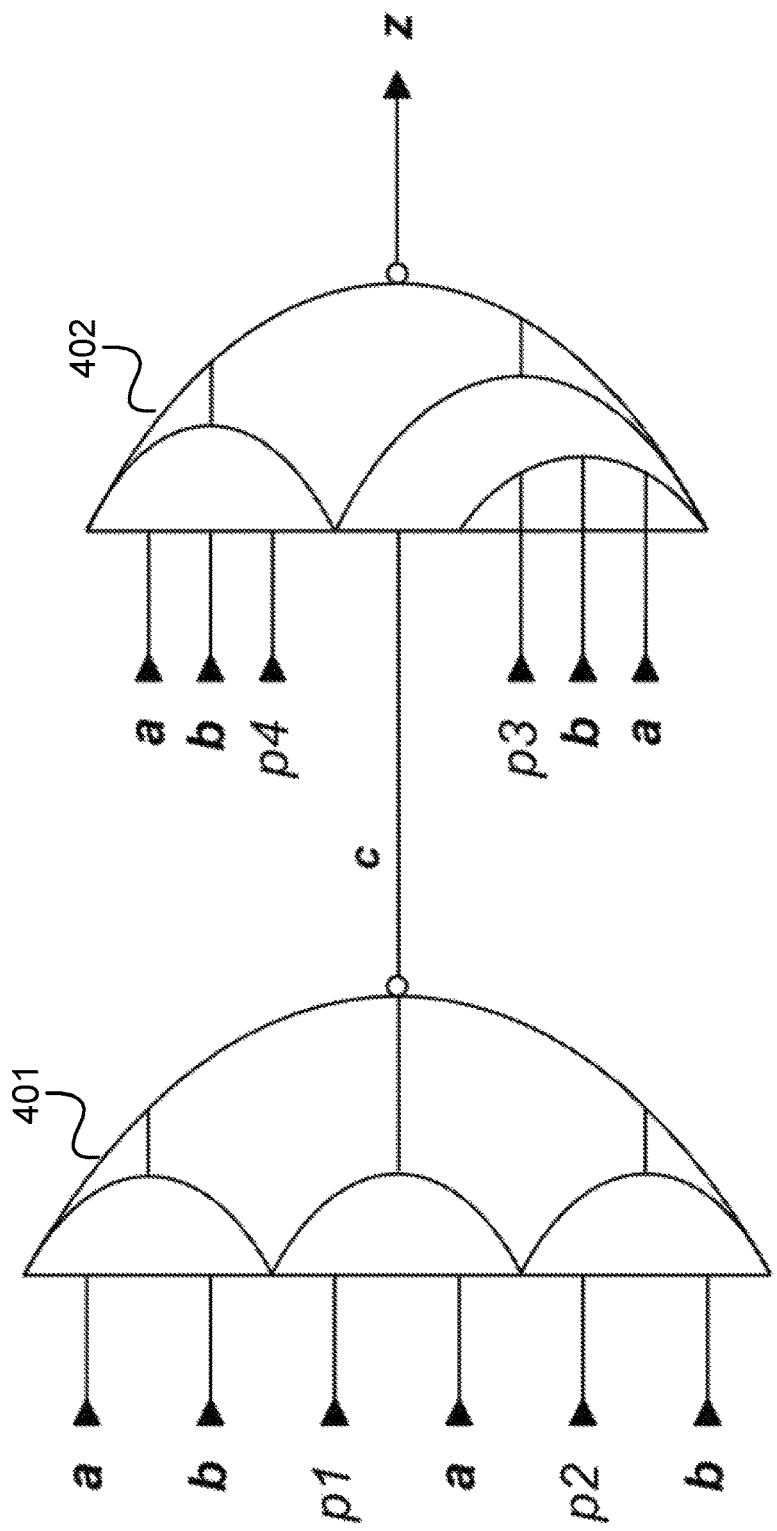
FIG. 4 shows a representation of a universal gate in gate symbols according to an embodiment.

FIG. 4 shows a representation of a universal gate 400 in gate symbols according to an embodiment.

The universal gate 400 (also referred to as UG(2)) receives a first data input bit a, a second data input bit b and four program bits (or control bits) $p_4$, $p_3$, $p_2$ and $p_1$. Each combination of the program bits $p_4$, $p_3$, $p_2$ and $p_1$ is associated with a 2-bit Boolean function (of data input bits a and b) as given by table 1.

The universal gate 400 includes a MULTI-AND-NOR gate 401 and a AND-ORAND-NOR gate 402.

The MULTI-AND-NOR gate 401 has three pairs of AND inputs (wherein each pair is AND combined) wherein one pair is supplied with a and b, one pair is supplied with p1 and a and one pair is supplied with p2 and b. The results of the AND combinations are NOR-combined to generate the output of the MULTI-AND-NOR gate 401 referred to as c.

The MULTI-AND-NOR gate 401 realizes a Boolean function of a and b depending on the values of p1 and p2 as indicated in table 2.

TABLE 2

| p2 | p1 | C | Function |
|----|----|---|----------|
| 0 | 0 | $\overline{a \cdot b}$ | NAND |
| 0 | 1 | $\bar{a}$ | INV (i.e. NOT) |
| 1 | 0 | $\bar{b}$ | INV |
| 1 | 1 | $\overline{a+b}$ | NOR |

Figure 5:
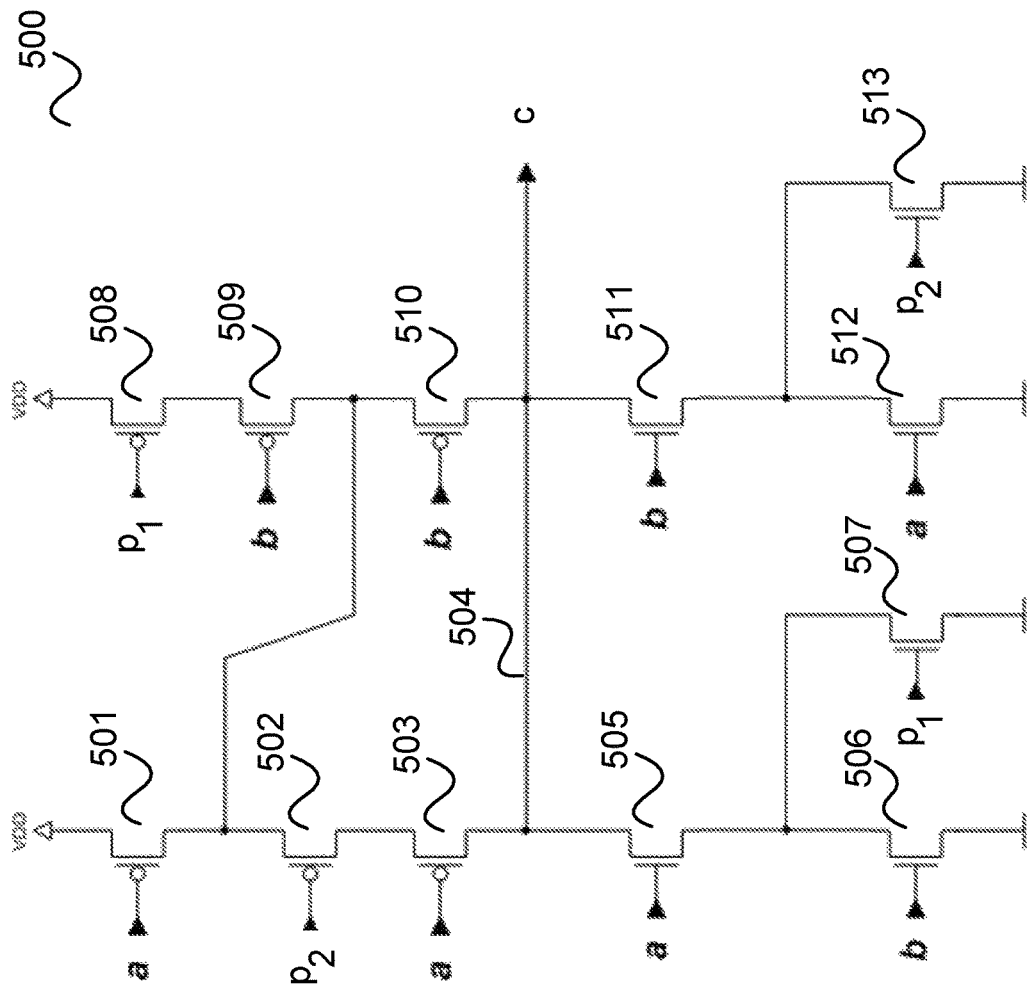
FIG. 5 shows an example of a transistor-level implementation of a MULTI-AND-NOR gate according to an embodiment.

FIG. 5 shows an example of a transistor-level implementation of a MULTI-AND-NOR gate 500 according to an embodiment.

The gate 500 includes a first p channel field effect transistor (pFET) 501, e.g. a MOSFET (metal oxide semiconductor FET), whose source is connected to a high supply potential (VDD), whose gate is supplied with a and whose drain is connected to the source of a second pFET 502, whose gate is supplied with $p_2$ and whose drain is connected to a third pFET 503 whose gate is supplied with a and whose drain is connected to an output node 504.

The output node 504 is further connected to the drain of a first n channel FET (nFET) 505 whose gate is supplied with a and whose source is connected to the drain of a second nFET 506 whose gate is supplied with b and whose source is connected to a low supply potential (VSS or ground). The source of the second nFET 505 is further connected to the drain of a third nFET 507 whose gate is supplied with $p_1$ and whose source is connected to the low supply potential.

The gate 500 includes a fourth pFET 508 whose source is connected to the high supply potential, whose gate is supplied with $p_1$ and whose drain is connected to the source of a fourth pFET 509, whose gate is supplied with b and whose drain is connected to a sixth pFET 510 whose gate is supplied with b and whose drain is connected to the output node 504.

The output node 504 is further connected to the drain of a fourth nFET 511 whose gate is supplied with b and whose source is connected to the drain of a fifth nFET 512 whose gate is supplied with a and whose source is connected to the low supply potential. The source of the fourth nFET 511 is further connected to the drain of a sixth nFET 513 whose gate is supplied with $p_2$ and whose source is connected to the low supply potential.

The drain of the first pFET 501 is connected to the drain of the fifth pFET 509.

The AND-ORAND-NOR gate 402 has three inputs which are AND combined and which are supplied with a, b and $p_4$. Further, the AND-ORAND-NOR gate 402 has three inputs which are OR combined and which are supplied with $p_3$, b and a. The result of the OR combination is AND combined with the output c of the MULTI-AND-NOR gate 401. The AND combinations are NOR combined to generate its output z which is also the output of the universal gate 400.

The AND-ORAND-NOR gate 402 realizes a Boolean function of a and b depending on the values of $p_4$ and $p_3$ as indicated in table 3.

TABLE 3

| p4 | p3 | Z | Function |
|----|----|---|----------|
| 0 | 0 | $\overline{c \cdot (a+b)}$ | ORNAND |
| 0 | 1 | $\bar{c}$ | INV |
| 1 | 0 | $\overline{a \cdot b + b \cdot c + c \cdot a}$ | MAJOR |
| 1 | 1 | $\overline{c + a \cdot b}$ | ANDNOR |

Figure 6:
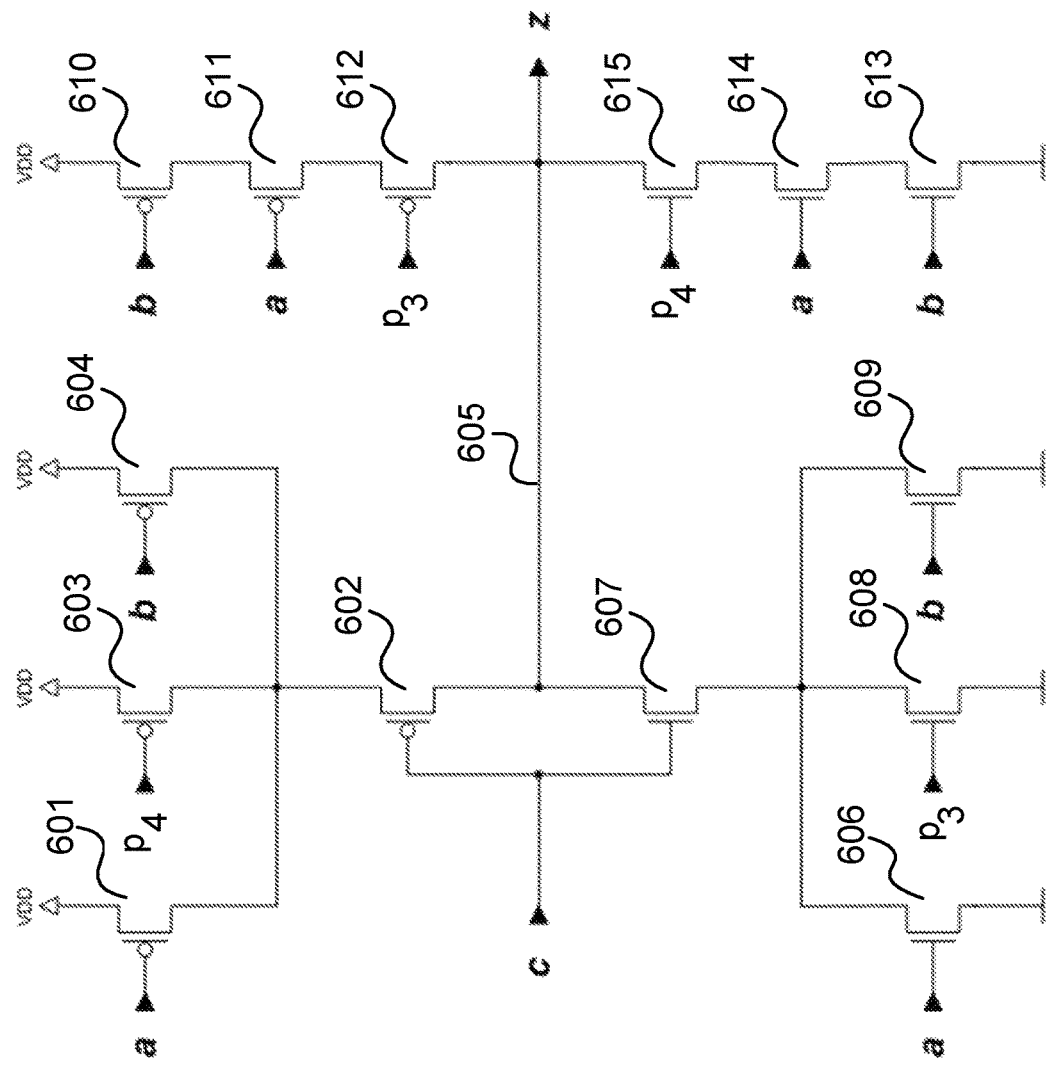
FIG. 6 shows an example of a transistor-level implementation of a AND-ORAND-NOR gate according to an embodiment.

FIG. 6 shows an example of a transistor-level implementation of a AND-ORAND-NOR gate 600 according to an embodiment.

The gate 600 includes a first pFET 601 whose source is connected to a high supply potential, whose gate is supplied with a and whose drain is connected to the source of a second pFET 602, a third pFET 603 whose source is connected to the high supply potential whose gate is supplied with $p_4$ and whose drain is connected to the source of the second pFET 602 and a fourth pFET 604 whose source is connected to the high supply potential, whose gate is supplied with b and whose drain is connected to the source of the second pFET 602.

The gate of the second pFET 602 is supplied with c and the drain of the second pFET 602 is connected to an output node 605.

The gate 600 further includes a first nFET 606 whose source is connected to a low supply potential, whose gate is supplied with a and whose drain is connected to the source of a second nFET 607, a third nFET 608 whose source is connected to the low supply potential, whose gate is supplied with $p_3$ and whose drain is connected to the source of the second nFET 607 and a fourth nFET 609 whose source is connected to the low supply potential whose gate is supplied with b and whose drain is connected to the source of the second nFET 607.

The gate of the second nFET 607 is supplied with c and the drain of the second nFET 607 is connected to the output node 605.

The gate 600 further includes a fifth pFET 610 whose source is connected to the high supply potential, whose gate is supplied with b and whose drain is connected to the source of sixth pFET 611 whose gate is supplied with a and whose drain is connected to the source of a seventh pFET 612 whose gate is supplied with $p_3$ and whose drain is connected to the output node 605.

The gate 600 further includes a fifth nFET 613 whose source is connected to low high supply potential, whose gate is supplied with b and whose drain is connected to the source of sixth nFET 614 whose gate is supplied with a and whose drain is connected to the source of a seventh nFET 615 whose gate is supplied with $p_4$ and whose drain is connected to the output node 605.

Figure 7:
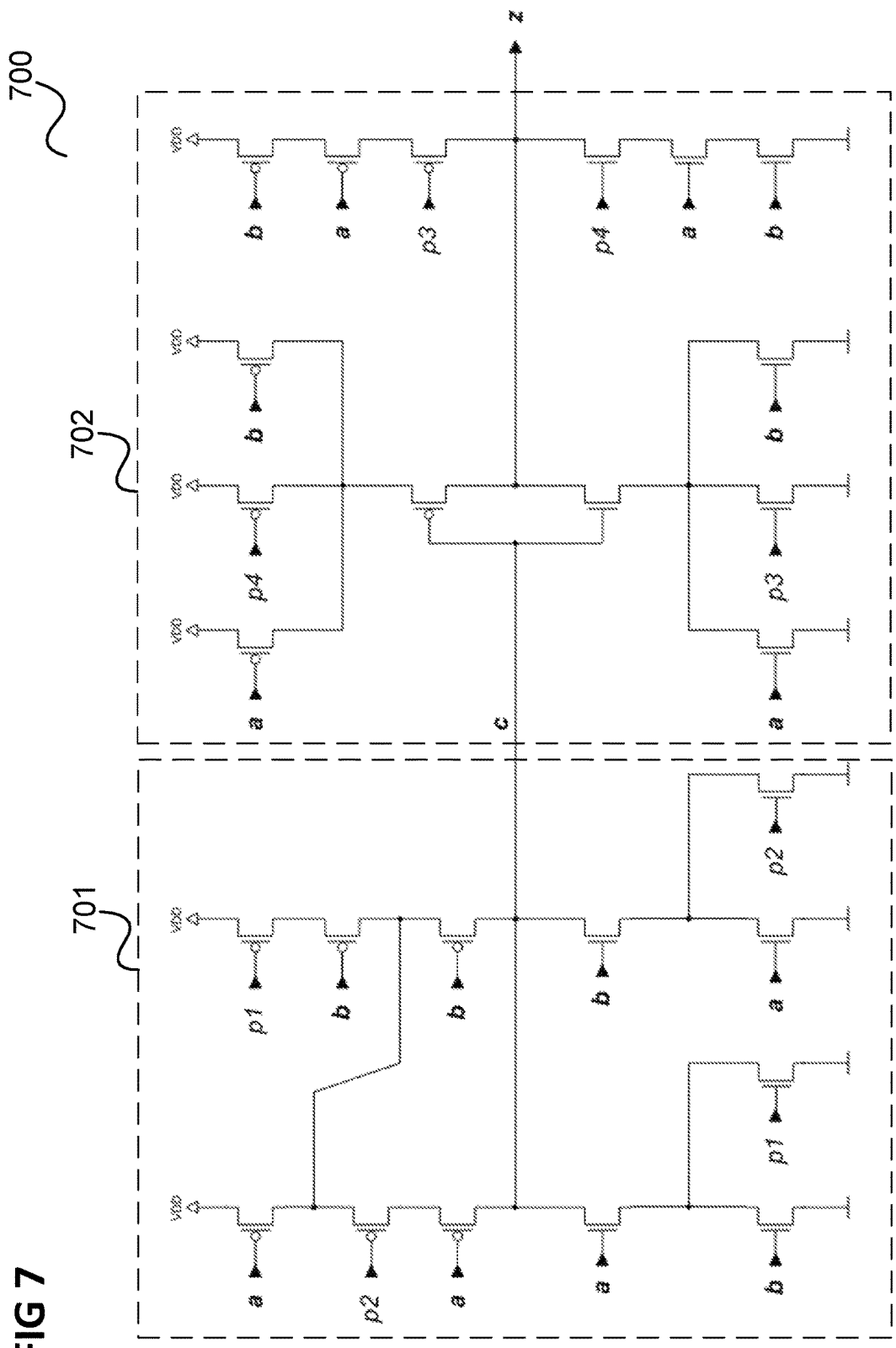
FIG. 7 shows an example of a transistor-level implementation of a universal gate according to an embodiment.

FIG. 7 shows an example of a transistor-level implementation of a universal gate 700 according to an embodiment.

The universal gate 700 includes a MULTI-AND-NOR gate 701 implemented as described with reference to FIG. 5 and a AND-ORAND-NOR gate 702 implemented as described with reference to FIG. 6.

It should be noted that the implementation of FIG. 7 is only an example and the transistors may be rearranged, e.g. according to a reordering of the logic combinations of the various inputs.

Figure 8:
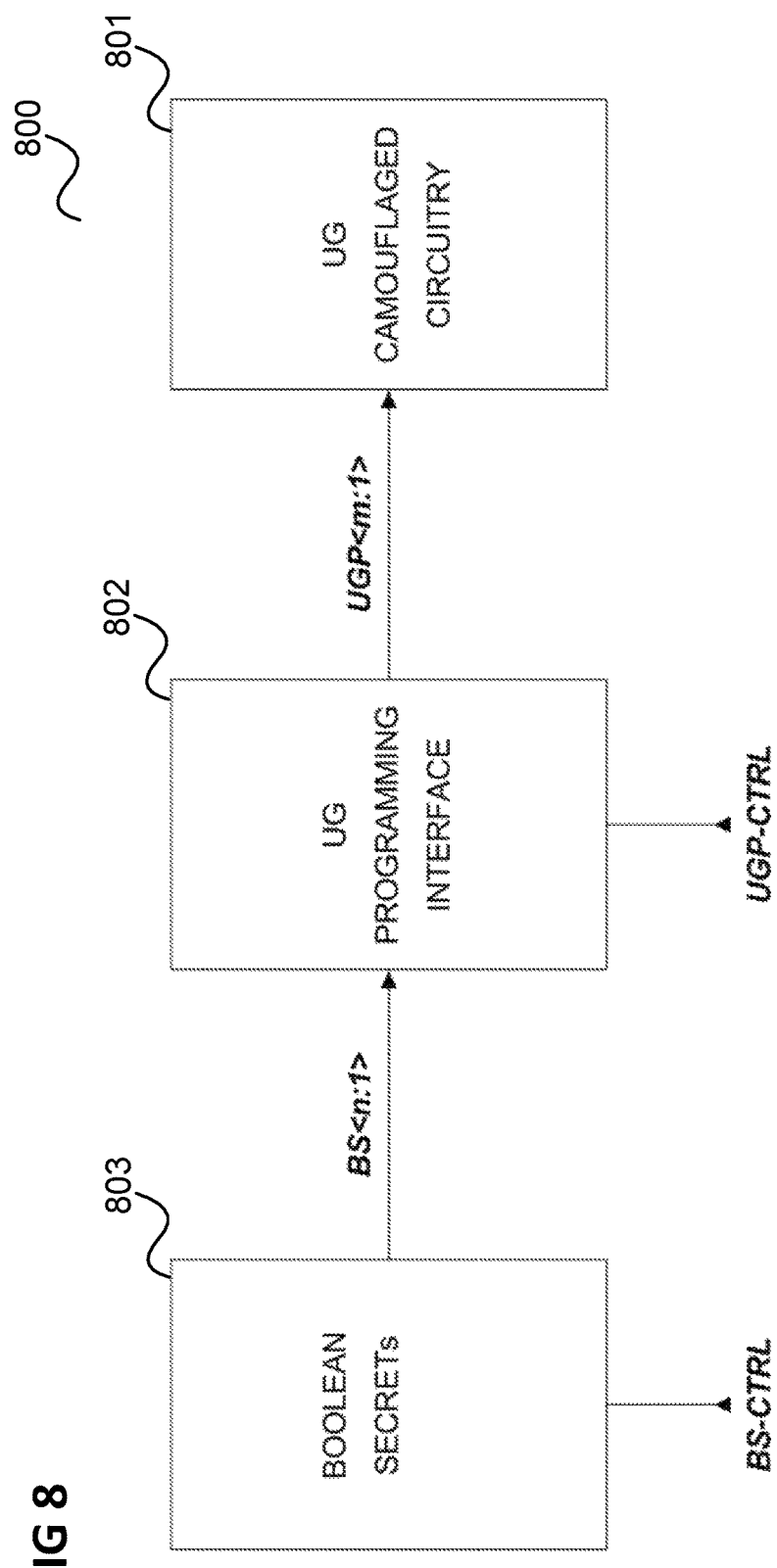
FIG. 8 shows a circuit arrangement.

FIG. 8 shows a circuit arrangement 800.

The circuit arrangement 800 includes a UG (universal gate) camouflaged circuitry 801, e.g. including one or more universal gates of FIG. 4 whose control bits (or program bits) are provided by a UG Programming Interface 802 that processes Boolean secrets provided by a Boolean secret source 803. The Boolean secrets may for example be provided by indistinguishable TIE cells, i.e. cells whose output is not apparent from its logic components and connections but depends on, e.g. a relative doping concentrations related to MOSFETS of competing paths.

The Boolean secrets may further depend on a control signal BS-CTRL and the operation of the programming interface may depend on a control signal UGP-CTRL.

Since the function of the UG camouflaged circuit 803 depends on the program bits and may include a plurality of universal gates, the values of the program bits which lead to the correct function of the chip may be seen as a key necessary for the correct operation of the chip. The UG camouflaged circuit 803 may include a plurality of universal gates which may be provided with different values of the program bits such that the length of the key may be chosen as high as desired.

The UG Programming Interface 802 may vary from a simple route-through of the Boolean Secrets to the UG Camouflaged Circuity (i.e. no extra gate count), up to fully real-time programmable UG control signals, e.g. a Latch plus an XOR gate for each UG control bit (=>about 5 GE per control bit=>20 GE per UG)

The UG Camouflaged Circuitry 801 may first be synthesized with a library containing exactly the cells subset that is covered by, e.g., UG(2), i.e. {EN2, EO2, ND2, NR2, AN2, OR2, AN2I, OR2I, IV2, MX2} and then each of the inferred gates can be replaced by an UG(2), each of which may then be connected to appropriate control bits from the UG Programming Interface 802.

It should be noted that the MULTI-AND-NOR and the AND-ORAND-NOR gate may also be deployed as stand-alone elements for circuit camouflage.

Figure 9:
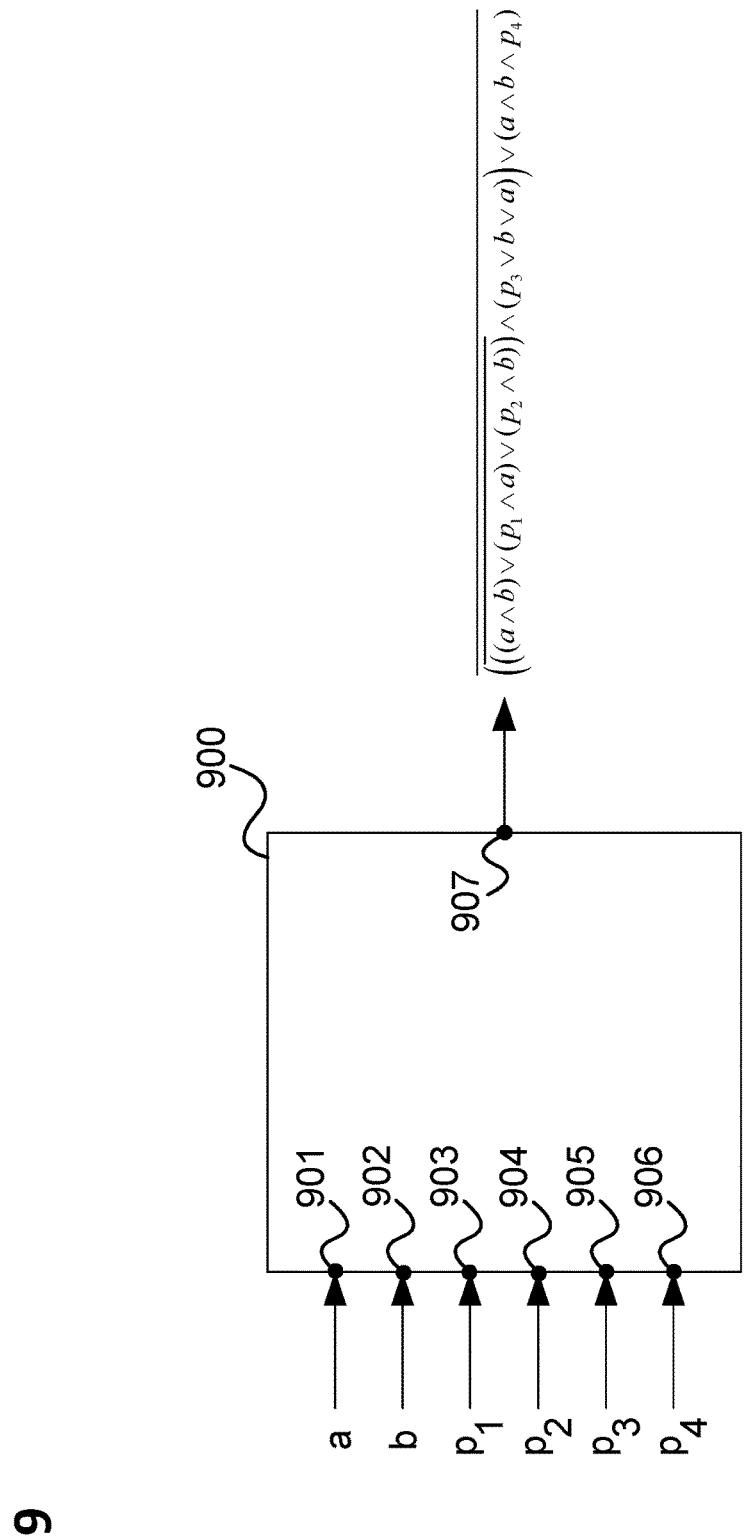
FIG. 9 shows a programmable logic circuit.

In summary, according to various embodiments, a circuit is provided as illustrated in FIG. 9.

FIG. 9 shows a programmable logic circuit 900.

The programmable logic circuit 900 includes a first data bit input 901 to receive a first data bit a and a second data bit input 902 to receive a second data bit b, a first program bit input 903 to receive a first program bit $p_1$, a second program bit input 904 to receive a second program bit $p_2$, a third program bit input 905 to receive a third program bit $p_3$ and a fourth program 906 bit to receive a fourth program bit $p_4$.

Further, the programmable logic circuit 900 includes an output 907 configured to output $$\overline{(((a \wedge b) \vee (p_1 \wedge a) \vee (p_2 \wedge b)) \wedge (p_3 \vee b \vee a)) \vee (a \wedge b \wedge p_4)}. \qquad (1)$$

In other words, according to various embodiments, a logic circuit is provided which implements a Boolean function (with 2 bit input and 1 bit output) wherein the Boolean function implemented is given by four program bits supplied to the logic circuit.

It should be noted that the formula (1) may be equivalently written in other forms, i.e. put into another form according to the Rules of Boolean Algebra, e.g. may be written as $$\overline{(a \wedge b) \vee (p_1 \wedge a) \vee (p_2 \wedge b) \vee \overline{(p_3 \vee b \vee a)}} \vee (a \wedge b \wedge p_4) \qquad (2)$$

or as $$((a \wedge b) \vee (p_1 \wedge a) \vee (p_2 \wedge b) \vee \overline{(p_3 \vee b \vee a)}) \wedge \overline{(a \wedge b \wedge p_4)} \qquad (3)$$

Further, it should be noted that formula (1) may be equivalently written by using AND, OR and NOT instead of $\wedge$, $\vee$ and $\overline{...}$ as NOT ((NOT ((a AND b) OR ($p_1$ AND a) OR ($p_2$ AND b)) AND ($p_3$ OR b OR a)) OR (a AND b AND $p_4$)) (4)

However, the result, i.e. the output, for the same input data bits and the same program bits is the same such that the circuit could also be characterized by one of the above or any other reformulation of the above formula.

Similarly, the order in which the input data bits and the program bits are logically combined in the circuit may vary and may follow any one of the above formulas (1) to (3) or any other reformulation of (1). The input data bits and the program bits may be logically combined in any order and any way as long as the result for each combination of values a, b, $p_1$, $p_2$, $p_3$, $p_4$ is equal or equivalent to (1).

The circuit 900 may for example be used in a method as illustrated in FIG. 10.

FIG. 10 shows a flow diagram 1000 for implementing a Boolean function.

In 1001, a programmable logic circuit as described with reference to FIG. 10 is provided.

In 1002, values of program bits $p_1$, $p_2$, $p_3$, $p_4$ of the circuit associated with a Boolean function to be implemented by the circuit are determined.

In 1003, the determined values are supplied as program bits $p_1$, $p_2$, $p_3$, $p_4$ to the circuit.

Further, a control circuit according to the method illustrated in FIG. 10, i.e. configured to perform the method of FIG. 10 may be provided.

Various examples are described below:

Example 1 is a programmable logic circuit as illustrated in FIG. 9.

Example 2 is the programmable logic circuit of Example 1, comprising a plurality of field effect transistors and at least one of the program bit inputs and the data bit inputs is coupled to the gate of a field effect transistor.

Example 3 is the programmable logic circuit of Example 1, wherein the programmable logic circuit comprises for each of the data bit inputs at least one respective field effect transistor wherein the data bit input is coupled to the gate of the respective field effect transistor and comprises for each of the program bit inputs at least one respective field effect transistor wherein the program bit input is coupled to the gate of the respective field effect transistor.

Example 4 is the programmable logic circuit of Example 2 or 3, wherein the field effect transistors comprise p channel field effect transistors and n channel field effect transistors.

Example 5 is the programmable logic circuit of any one of Examples 1 to 4, wherein the programmable logic circuit is implemented in Complementary Metal Oxide Semiconductor technology.

Example 6 is the programmable logic circuit of any one of Examples 1 to 5, wherein the programmable logic circuit comprises a MULTI-AND-NOR gate and an AND-ORAND-NOR gate.

Example 7 is the programmable logic circuit of Example 6, wherein the MULTI-AND-NOR gate is supplied with a, b, p1 and p2 and the AND-ORAND-NOR gate is supplied with a, b, p3 and p4 and the output of the MULTI-AND-NOR gate.

Example 8 is the programmable logic circuit of Example 6 or 7, wherein the MULTI-AND-NOR gate has three pairs of AND inputs wherein each pair is AND combined wherein one pair is supplied with a and b, one pair is supplied with p1 and a and one pair is supplied with p2 and b and wherein the results of the AND combinations are NOR-combined to generate the output of the MULTI-AND-NOR gate.

Example 9 is the programmable logic circuit of any one of Examples 6 to 8, wherein the AND-ORAND-NOR gate has three inputs which are AND combined and which are supplied with a, b and $p_4$, three inputs which are OR combined and which are supplied with $p_3$, b and a and wherein the result of the OR combination is AND combined with the output of the MULTI-AND-NOR gate and the AND combinations are NOR combined to generate the output of the AND-ORAND-NOR gate.

Example 10 is the programmable logic circuit of any one of Examples 6 to 9, wherein the output of the AND-ORAND-NOR gate is the output of the programmable logic circuit.

Example 11 is a method for implementing a Boolean function comprising providing a circuit according to any one of Examples 1 to 10, determining values of program bits p1, p2, p3, p4 of the circuit associated with a Boolean function to be implemented by the circuit and supplying the determined values as program bits p1, p2, p3, p4 to the circuit.

Example 12 is a control circuit comprising a determiner configured to determine values of program bits $p_1$, $p_2$, $p_3$, $p_4$ of the circuit according to any one of Examples 1 to 10 associated with a Boolean function to be implemented by the circuit and an output configured to supply the determined values as program bits $p_1$, $p_2$, $p_3$, $p_4$ to the circuit.

According to a further example, a programmable logic circuit is provided including a plurality of circuit elements (e.g. field effect transistors) connected in such a way that the programmable logic circuit implements, depending on the values of control bits (e.g. depending on the combination of values of four control bits) any 2-bit-input 1-bit-output Boolean function.

It should be noted that embodiments and examples described in context of one of the circuits are analogously valid and applicable to the other device as well as the method and vice versa.

While specific aspects have been described, it should be understood by those skilled in the art that various changes in form and detail may be made therein without departing from the spirit and scope of the aspects of this disclosure as defined by the appended claims. The scope is thus indicated by the appended claims and all changes which come within the meaning and range of equivalency of the claims are therefore intended to be embraced.

What is claimed is:

1. A programmable logic circuit comprising:
    a first data bit input to receive a first data bit a and a second data bit input to receive a second data bit b;
    a first program bit input to receive a first program bit $p_1$, a second program bit input to receive a second program bit $p_2$, a third program bit input to receive a third program bit $p_3$ and a fourth program bit to receive a fourth program bit $p_4$, and a plurality of field effect transistors and at least one of the program bit inputs and the data bit inputs is coupled to the gate of a field effect transistor; and
    an output configured to output $$\overline{(((a \wedge b) \vee (p_1 \wedge a) \vee (p_2 \wedge b)) \wedge (p_3 \vee b \vee a)) \vee (a \wedge b \wedge p_4)}.$$

2. The programmable logic circuit of claim 1, wherein the programmable logic circuit comprises for each of the data bit inputs at least one respective field effect transistor, wherein the data bit input is coupled to the gate of the respective field effect transistor and comprises for each of the program bit inputs at least one respective field effect transistor, wherein the program bit input is coupled to the gate of the respective field effect transistor.

3. The programmable logic circuit of claim 1, wherein the field effect transistors comprise p channel field effect transistors and n channel field effect transistors.

4. The programmable logic circuit of claim 1, wherein the programmable logic circuit is implemented in Complementary Metal Oxide Semiconductor technology.

5. The programmable logic circuit of claim 1, wherein the programmable logic circuit comprises a MULTI-AND-NOR gate and an AND-ORAND-NOR gate.

6. The programmable logic circuit of claim 5, wherein the MULTI-AND-NOR gate is supplied with a, b, p1 and p2 and the AND-ORAND-NOR gate is supplied with a, b, p3 and p4 and the output of the MULTI-AND-NOR gate.

7. The programmable logic circuit of claim 5, wherein the MULTI-AND-NOR gate has three pairs of AND inputs, wherein each pair is AND combined, wherein one pair is supplied with a and b, one pair is supplied with p1 and a and one pair is supplied with p2 and b, and wherein the results of the AND combinations are NOR-combined to generate the output of the MULTI-AND-NOR gate.

8. The programmable logic circuit of claim 5, wherein the AND-ORAND-NOR gate has three inputs which are AND combined and which are supplied with a, b and $p_4$, three inputs which are OR combined and which are supplied with $p_3$, b and a and wherein the result of the OR combination is AND combined with the output of the MULTI-AND-NOR gate and the AND combinations are NOR combined to generate the output of the AND-ORAND-NOR gate.

9. The programmable logic circuit of claim 5, wherein the output of the AND-ORAND-NOR gate is the output of the programmable logic circuit.

10. A method for implementing a Boolean function;
providing a circuit, wherein the circuit comprises:
 a first data bit input to receive a first data bit a and a second data bit input to receive a second data bit b;
 a first program bit input to receive a first program bit $p_1$, a second program bit input to receive a second program bit $p_2$, a third program bit input to receive a third program bit $p_3$ and a fourth program bit to receive a fourth program bit $p_4$,
 a plurality of field effect transistors and at least one of the program bit inputs and the data bit inputs is coupled to the gate of a field effect transistor; and
 an output configured to output $$\overline{(((a \wedge b) \vee (p_1 \wedge a) \vee (p_2 \wedge b)) \wedge (p_3 \vee b \vee a)) \vee (a \wedge b \wedge p_4)};$$

determining values of program bits p1, p2, p3, p4 of the circuit associated with a Boolean function to be implemented by the circuit; and
supplying the determined values as program bits p1, p2, p3, p4 to the circuit.

11. A control circuit comprising
a determiner configured to determine values of program bits $p_1$, $p_2$, $p_3 p_4$ of the circuit associated with a Boolean function to be implemented by the circuit, wherein the circuit comprises:
 a first data bit input to receive a first data bit a and a second data bit input to receive a second data bit b;
 a first program bit input to receive a first program bit $p_1$, a second program bit input to receive a second program bit $p_2$, a third program bit input to receive a third program bit $p_3$ and a fourth program bit to receive a fourth program bit $p_4$,
 a plurality of field effect transistors and at least one of the program bit inputs and the data bit inputs is coupled to the gate of a field effect transistor; and
 an output configured to output $$\overline{(((a \wedge b) \vee (p_1 \wedge a) \vee (p_2 \wedge b)) \wedge (p_3 \vee b \vee a)) \vee (a \wedge b \wedge p_4)};$$

and
an output configured to supply the determined values as program bits $p_1$, $p_2$, $p_3$, $p_4$ to the circuit.

* * * * *